(12) United States Patent
Junes et al.

(10) Patent No.: US 11,181,574 B2
(45) Date of Patent: Nov. 23, 2021

(54) TESTING DEVICE INCLUDES RADIATION SHIELDS FOR TESTING INTEGRATED CIRCUITS ON A WAFER

(71) Applicants: Afore Oy, Lieto (FI); BlueFors Cryogenics Oy, Helsinki (FI)

(72) Inventors: Aki Junes, Turku (FI); Ari Kuukkala, Turku (FI); Timo Salminen, Turku (FI); Vesa Henttonen, Turku (FI); Matti Manninen, Espoo (FI); David Gunnarsson, Helsinki (FI); Leif Roschier, Vantaa (FI)

(73) Assignees: Afore Oy, Lieto (FI); Bluefors Cryogenics Oy, Helsinki (FI)

( * ) Notice: Subject to any disclaimer, the term of this patent is extended or adjusted under 35 U.S.C. 154(b) by 30 days.

(21) Appl. No.: 16/861,257

(22) Filed: Apr. 29, 2020

(65) Prior Publication Data
US 2020/0348357 A1    Nov. 5, 2020

(30) Foreign Application Priority Data
May 3, 2019  (EP) .................................... 19172489

(51) Int. Cl.
*G01R 31/28*    (2006.01)
(52) U.S. Cl.
CPC ..... *G01R 31/2887* (2013.01); *G01R 31/2862* (2013.01); *G01R 31/2865* (2013.01)
(58) Field of Classification Search
CPC .. G01R 31/2887; G01R 1/18; G01R 31/2886; G01R 1/06705; G01R 1/07392;
(Continued)

(56) References Cited

U.S. PATENT DOCUMENTS

| 5,835,997 A | * | 11/1998 | Yassine | .................... | G01R 1/18 |
| | | | | | 324/750.14 |
| 6,424,141 B1 | * | 7/2002 | Hollman | .................. | G01R 1/18 |
| | | | | | 324/750.19 |

(Continued)

OTHER PUBLICATIONS

MicroXact Inc: "MicroXact Semi-Automated Cryogenic Probe Station", YouTube, Oct. 3, 2016 (Oct. 3, 2016), p. 1, XP054979855, Retrieved from the Internet: URL:https://youtube.com./watch?v=2w7X2TRU7R8 [retrieved on Oct. 28, 2019].

(Continued)

*Primary Examiner* — Vinh P Nguyen
(74) *Attorney, Agent, or Firm* — Merchant & Gould P.C.

(57) ABSTRACT

The present invention provides a testing device for electrically testing integrated circuits on a wafer. The testing device comprises a vacuum chamber, a chuck for holding the wafer, a probe card for electrically contacting the integrated circuits, means for moving the chuck relative to the probe card, a first radiation shield arranged inside the vacuum chamber and enclosing the chuck and the probe card, and a cooling unit thermally connected to the first radiation shield. The means for moving the chuck relative to the probe card comprises a supporting column having a first end and a second end, the first end of the supporting column being attached to the chuck, and the first radiation shield comprises a first fixed part having a first aperture through which the supporting column is arranged to pass, and a first movable part that is attached to the supporting column and arranged to cover the first aperture.

16 Claims, 4 Drawing Sheets

(58) Field of Classification Search
CPC .... G01R 3/00; G01R 1/0416; G01R 1/06794;
G01R 31/2865; G01R 31/2891; G01R
1/07314; G01R 31/2862; G01R 1/06744;
G01R 1/06738; G01R 1/06772; G01R
31/2875; G01R 1/025; G01R 1/0491;
G01R 1/06722; G01R 1/06733; G01R
1/06761; G01R 1/07; G01R 1/07307;
G01R 1/07371; G01R 1/07378; G01R
31/2851; G01R 31/2889; G01R 31/3025;
G01R 31/286; G01R 31/307; G01R
19/0053; G01R 1/04; G01R 1/0408;
G01R 1/0466; G01R 29/26; G01R
31/002; G01R 31/2808; G01R 31/2831;
G01R 31/2849; G01R 31/2855; G01R
31/2868; G01R 31/2874; G01R 31/2877;
G01R 31/2879; G01R 1/0458; G01R
1/06716; G01R 1/07342; G01R 31/2863;
G01R 31/2893; G01R 31/311; G01R
35/005
See application file for complete search history.

(56) References Cited

U.S. PATENT DOCUMENTS

| | | | |
|---|---|---|---|
| 6,700,397 B2* | 3/2004 | Hollman | G01R 1/18 324/750.16 |
| 2006/0266053 A1 | 11/2006 | Jiang et al. | |
| 2009/0045829 A1* | 2/2009 | Awazu | G01R 31/2865 324/762.05 |
| 2014/0239991 A1 | 8/2014 | Teich et al. | |
| 2019/0041454 A1* | 2/2019 | Akiyama | G01R 31/2893 |

OTHER PUBLICATIONS

Russell Damon et al.: "Cryogenic probe station for on-wafer characterization of electrical devices", Review of Scientific Instrcuments AIP, Melville NY, US, vol. 83, No. 4, A Apr. 2012, p. 44703-44703, XP012162238.

N.A, N.A.: "CPS-150-LN2/Lhe-HV", Apr. 2, 2017, pp. 1-3, XP055635810, Retrieved from the Internet, the whole documents.

N.A., N.A.: "FWP6 Probe Station Operating Guide", Jun. 1, 2005, pp. 1-70, XP055635817, Retrieved from the Internet, the whole document.

Michael Cyberey et al.: "Closeout report for "Advanced Materials and On-wafer Chip Evaluation: 2nd Generation ALMA Superconducting Mixers"", ALMA Development Studies (Cycle 3), Mar. 1, 2017, pp. 1-44, XP055635734, Retrieved from the Internet, the whole document.

Chiao Meng P et al.: "System design and implementation of the detector assemply of the Astro-H soft x-ray spectrometer", Journal of Astronomical Telescopes, instrcuments, and systems, Society of Photo-Optical Instrcumentation Enfineers, 1000 20th St. Bellingham WA 98225-6705 USA, vol. 4, No. 2, Apr. 1, 2018, p. 21404, XP060107001. the whole document.

Ari Kuukkala: "Quantum Computing Sets New Demand for Wafer Probing", Semiconductor Wafer Test Conference 2019, Jun. 5, 2019, XP055635796, San Diego, California. Retrieved from the Internet.

European Search Report, EP19172489, dated Oct. 31, 2019, 2 pages.

* cited by examiner

TESTING DEVICE INCLUDES RADIATION SHIELDS FOR TESTING INTEGRATED CIRCUITS ON A WAFER

PRIORITY

This application claims the priority of European patent application number 19172489.7 filed on May 3, 2019, the contents of which are fully incorporated herein by reference.

TECHNICAL FIELD OF THE INVENTION

The present invention relates to a testing device according to the preamble of the appended independent claim.

BACKGROUND OF THE INVENTION

Semiconductor device fabrication is a commonly used process for creating integrated circuits on a wafer made of a semiconductor material using multiple-step sequence of photolithographic and chemical processing steps. As a part of the process, the integrated circuits created on the wafer are typically tested for functional defects by applying special test patterns to them. This testing is performed by using a testing device called a wafer prober.

An example of a known wafer prober comprises a chuck for holding a wafer to be tested and a probe card for electrically contacting integrated circuits on the wafer. The probe card is electrically connected to an electronic testing unit that electrically tests the integrated circuits according to a test program. The test program defines the contents of test patterns and the sequence by which they are applied to the integrated circuits. The chuck and the probe card are arranged inside a chamber, which allows the integrated circuits to be tested in a controlled environment. For electrical testing, the probe card is held in place while the wafer mounted on the chuck is moved between testing positions. In each testing position, contact elements of the probe card are arranged in electrical contact with contact pads of a set of integrated circuits, which are then electrically tested with the electronic testing unit.

A problem associated with known wafer probers is that testing of integrated circuits is time and energy-consuming, and difficult or even impossible at very low temperatures, especially below 4 K. This is because the space in which the integrated circuits are tested is not well thermally shielded from its surrounding. Furthermore, in known wafer probers there are heat generating parts and components in the testing space, which makes its cooling difficult.

OBJECTIVES OF THE INVENTION

It is the main objective of the present invention to reduce or even eliminate the prior art problems presented above.

It is an objective of the present invention to provide a testing device for electrically testing integrated circuits on a wafer. In more detail, it is an objective of the invention to provide a testing device enabling to electrically test integrated circuits on a wafer at very low temperatures, and even below 4 K. It is a further objective of the present invention to provide a testing device enabling to quickly and energy efficiently cool the space in which integrated circuits are tested to a desired testing temperature and to maintain the temperature using a minimum amount of energy. It is yet a further objective of the present invention to provide a testing device where the space in which integrated circuits are tested is well thermally shielded from its surrounding.

In order to realise the above-mentioned objectives, the testing device according to the invention is characterised by what is presented in the characterising portion of the appended independent claim. Advantageous embodiments of the invention are described in the dependent claims.

DESCRIPTION OF THE INVENTION

A testing device according to the invention comprises a vacuum chamber, a chuck for holding a wafer that comprises integrated circuits, a probe card for electrically contacting the integrated circuits on the wafer, means for moving the chuck relative to the probe card, a first radiation shield arranged inside the vacuum chamber and enclosing the chuck and the probe card, and a cooling unit thermally connected to the first radiation shield. In the testing device according to the invention, the means for moving the chuck relative to the probe card comprises a supporting column having a first end and a second end, the first end of the supporting column being attached to the chuck, and the first radiation shield comprises a first fixed part having a first aperture through which the supporting column is arranged to pass, and a first movable part that is attached to the supporting column and arranged to cover the first aperture.

The testing device according to the invention can be used for electrically testing integrated circuits on a wafer. The testing device can be called as a wafer prober.

The wafer to be tested is mounted on the chuck, which is moved between testing positions using the moving means. In each testing position, the probe card is in electrical contact with one or more integrated circuits, which can then be electrically tested.

The chuck is used to hold the wafer during testing of the integrated circuits. The chuck can be, for example, a mechanical chuck that comprises a plurality of heat conducting pins for holding the wafer on a base plate of the chuck. Alternatively, the chuck can be, for example, an electrostatic chuck that comprises a metal base plate coated with a layer of dielectric material. By providing a voltage difference between the metal base plate and the wafer, an electrostatic force holds the wafer on the chuck. To maintain the flatness of the wafer and facilitate the rapid transfer of heat from the wafer, the chuck is preferably made of a heat conducting material, such as copper or gold. The chuck can be made of gold-plated copper. These materials provide good thermal properties and performance.

The chuck is moved relative to the probe card with the moving means. The movement is transferred through the supporting column to the chuck that is attached to the first end of the supporting column. The chuck is preferably flat and arranged essentially perpendicular with respect to the longitudinal axis of the supporting column. The second end of the supporting column extends out of the first radiation shield. The moving means comprise one or more actuators attached to the supporting column for moving the supporting column and thus also the chuck that is attached to the first end of the supporting column. The one or more actuators are attached to the supporting column in such a manner that they are outside the first radiation shield, whereby they do not heat the interior of the first radiation shield. Preferably, the one or more actuators are attached to the second end of the supporting column and configured to move the supporting column in different directions.

The supporting column can be one-piece or multi-piece. The supporting column may comprise a first column part and a second column part arranged successively one after another in the longitudinal direction of the supporting column. A first end of the first column part can be attached to the chuck and a second end of the first column part can be attached to the first movable part. A first end of the second column part can be attached to the first movable part and a second end of the second column part can be attached to the actuator(s) or to a second movable part of a second radiation shield. In a case where the second end of the second column part is attached to the second movable part, the supporting column may comprise a third column part, a first end of which can be attached to the second movable part and a second end of which can be attached to the actuator(s). The supporting column can be a tube and it can be arranged to pass through the first movable part. The supporting column may comprise a plurality of tubes, which can be partly nested in one another or arranged successively one after another in the longitudinal direction of the supporting column. The first movable part can be attached between two successive tubes. The supporting column can be made of a metal, such as stainless steel, or other material having good mechanical properties and a low thermal conductivity.

The probe card is used to electrically contact the integrated circuits on the wafer. The probe card may comprise a printed circuit board (PCB) and one or more contact elements, which can be arranged in electrical contact with contact pads of the integrated circuits. The testing device may comprise a camera for optically locating the contact elements on the probe card and the contact pads on the wafer. By using this information, the contact pads of the integrated circuits to be tested can be aligned to the contact elements of the probe card.

The probe card can be thermally and mechanically attached to a probe card holder that is mechanically attached to the first fixed part of the first radiation shield with thermally isolating supports like thin-walled stainless steel tubes. The probe card can be, for example, a needle, vertical pin, or MEMS (Micro Electro-Mechanical System) type probe card depending on the shape and form of the contact elements. The contact elements of the probe card can, for example, be made of tungsten or a tungsten/rhenium alloy. The contact pads of the integrated circuits can, for example, be made of aluminium, copper, copper alloys or many types of solders such as lead-tin and tin-silver. Typically, the probe card is custom-built for each type of wafer so that every integrated circuit on the wafer can be electrically tested.

The chuck and the probe card are arranged inside the first radiation shield that comprises two shield parts. The first shield part, i.e. the first fixed part, has the first aperture through which the supporting column is arranged to pass so that the first end of the supporting column extends into the interior of the first radiation shield. The first aperture is preferably dimensioned in such a manner that the supporting column does not touch the first fixed part in any position of the chuck. Preferably, the shape of the first aperture is circular. The second shield part, i.e. the first movable part, is attached to the supporting column and arranged to cover the first aperture in any position of the chuck. The first aperture can be closed with the first movable part.

The first radiation shield acts as a thermal shield, reducing the heat transfer. In other words, the first radiation shield is a thermal radiation shield. The first radiation shield defines an essentially enclosed space into which the chuck and the probe card are placed. Preferably, the only path through which photons can get into the space enclosed by the first radiation shield is the gap between the first fixed part and the first movable part in connection with the first aperture. The number of photons leaking through the gap can be reduced by geometry and by adjusting the emissivity of the surfaces.

The first fixed part can be mechanically attached with thermally isolating supports like thin-walled stainless steel tubes to the vacuum chamber or to another radiation shield that encloses the first radiation shield. The first fixed part can comprise a cylindrical side wall, an upper end wall attached about its perimeter to the upper edge of the side wall, and a lower end wall provided with the first aperture and attached about its perimeter to the lower edge of the side wall. The first movable part can comprise a circular plate positioned below the lower end wall of the first fixed part to cover the first aperture. The lower end wall of the first fixed part can be provided with a first lip around the first aperture and the circular plate of the first movable part can be provided with a second lip arranged at its outer edge and facing the first lip. The first and second lips together with the lower end wall and the circular plate form a labyrinth seal that provides a tortuous path for photons and thus limits the amount of thermal radiation into the first radiation shield. The first fixed part and the first movable part of the first radiation shield can, for example, be made of aluminium.

The cooling unit is thermally connected to the first radiation shield. In this text, the expression "thermally connected" means that two members are connected such that heat can be conducted therebetween. The cooling unit is used for cooling the interior of the first radiation shield to a desired testing temperature and for maintaining the testing temperature during testing of the integrated circuits. The testing temperature inside the first radiation shield can be, for example, in the range of 1-4 K. The heat is transferred out of the first radiation shield through one or more thermal links connected between the cooling unit and the first radiation shield. The thermal link can be, for example, a cable or bar made of copper or aluminium. Preferably, the cooling unit is thermally connected to both the first fixed part and the first movable part. The cooling unit may comprise one or more temperature stages each of which is configured to provide a specific temperature to a part to which it is thermally connected. The cooling unit can be a closed loop circulation cooler based on helium.

The vacuum chamber allows the integrated circuits to be tested in a controlled environment. The conditions such as the pressure and temperature inside the vacuum chamber can be controlled using various devices. The testing device may comprise, for example, a vacuum pump attached to the vacuum chamber for controlling the pressure and a cooling unit attached to the vacuum chamber for controlling the temperature inside the vacuum chamber. The vacuum chamber can, for example, be made of stainless steel or aluminium. When testing the integrated circuits, the pressure inside the vacuum chamber is typically less than 10E-4 mbar.

The testing device comprises an electronic testing unit for electrically testing the integrated circuits on the wafer. The electronic testing unit is electrically connected to the probe card. The probe card provides an electrical path between the electronic testing unit and the integrated circuits on the wafer, thereby permitting the testing and validation of the integrated circuits. The electronic testing unit tests the integrated circuits according to a test program, which defines the contents of test patterns and the sequence by which they are applied to the integrated circuits. The electronic testing unit may comprise a processor and a memory including computer program code, the memory and the computer program code being configured to, with the processor, cause the electronic testing unit to electrically test the integrated circuits.

An advantage of the testing device according to the invention is that it enables to electrically test integrated circuits on a wafer at very low temperatures, and even below 4 K. Another advantage of the testing device according to the invention is that the space in which integrated circuits are tested, i.e. the interior of the first radiation shield, can be quickly and energy efficiently cooled to a desired testing temperature and the temperature can be maintained using a minimum amount of energy. Still another advantage of the testing device according to the invention is that the space in which integrated circuits are tested is well thermally shielded from its surrounding.

According to an embodiment of the invention the first movable part has a second aperture through which the supporting column is arranged to pass. The first movable part is attached to the supporting column so that there is no or a minimal gap between the supporting column and the first movable part. Preferably, in this embodiment the supporting column is a one-piece tube. The shape of the second aperture is preferably circular.

According to an embodiment of the invention the testing device comprises a second radiation shield arranged inside the vacuum chamber and enclosing the first radiation shield, the second radiation shield comprising a second fixed part having a third aperture through which the supporting column is arranged to pass and a second movable part that is attached to the supporting column and arranged to cover the third aperture.

The second radiation shield comprises two shield parts. The first shield part, i.e. the second fixed part, has the third aperture through which the supporting column is arranged to pass so that the second end of the supporting column extends out of the second radiation shield. The third aperture is preferably dimensioned in such a manner that the supporting column does not touch the second fixed part in any position of the chuck. Preferably, the shape of the third aperture is circular. The second shield part, i.e. the second movable part, is attached to the supporting column and arranged to cover the third aperture in any position of the chuck. The third aperture can be closed with the second movable part.

The second radiation shield acts as a thermal shield, reducing the heat transfer. In other words, the second radiation shield is a thermal radiation shield. The second radiation shield defines an essentially enclosed space into which the first radiation shield is placed. Preferably, the only path through which photons can get into the space enclosed by the second radiation shield is the gap between the second fixed part and the second movable part in connection with the third aperture. The number of photons leaking through the gap can be reduced by geometry and by adjusting the emissivity of the surfaces.

The second fixed part can be mechanically attached with thermally isolating supports like thin-walled stainless steel tubes to the vacuum chamber or to another radiation shield that encloses the second radiation shield. The second fixed part can comprise a cylindrical side wall, an upper end wall attached about its perimeter to the upper edge of the side wall, and a lower end wall provided with the third aperture and attached about its perimeter to the lower edge of the side wall. The second movable part can comprise a circular plate positioned above the lower end wall of the second fixed part to cover the third aperture. The lower end wall of the second fixed part can be provided with a first lip around the third aperture and the circular plate of the second movable part can be provided with a second lip arranged at its outer edge and facing the first lip. The first and second lips together with the lower end wall and the circular plate form a labyrinth seal that provides a tortuous path for photons and thus limits the amount of thermal radiation into the second radiation shield. The second fixed part and the second movable part of the second radiation shield can, for example, be made of aluminium.

An advantage of the second radiation shield is that it further improves the heat shielding of the testing device, whereby the desired testing temperature inside the first radiation shield can be achieved and maintained with a less amount of energy compared to a testing device having only one radiation shield.

According to an embodiment of the invention the second movable part has a fourth aperture through which the supporting column is arranged to pass. The second movable part is attached to the supporting column so that there is no or a minimal gap between the supporting column and the second movable part. Preferably, in this embodiment the supporting column is a one-piece tube. The shape of the fourth aperture is preferably circular.

According to an embodiment of the invention the cooling unit has a first temperature stage that is thermally connected to the first radiation shield and a second temperature stage that is thermally connected to the second radiation shield. The temperature stages of the cooling unit are configured to provide different temperatures to the radiation shields. The temperature that can be achieved with the first temperature stage is lower than the temperature that can be achieved with the second temperature stage. The temperature provided by the first temperature stage can be, for example, in the range of 3-5 K, or about 4 K, and the temperature provided by the second temperature stage can be, for example, in the range of 45-55 K, or about 50 K. The heat is transferred out of the first radiation shield through one or more thermal links connected between the first temperature stage and the first radiation shield. The heat is transferred out of the second radiation shield through one or more thermal links connected between the second temperature stage and the second radiation shield. The thermal link can be, for example, a cable or bar made of copper or aluminium. Preferably, the first temperature stage is thermally connected to both the first fixed part and the first movable part, and the second temperature stage is thermally connected to both the second fixed part and the second movable part.

An advantage of the cooling unit having two temperature stages is that the space in which integrated circuits are tested, i.e. the interior of the first radiation shield, can be more quickly and energy efficiently cooled to a desired testing temperature.

According to an embodiment of the invention the cooling unit has a third temperature stage that is thermally connected to the chuck and the probe card. Preferably, the third temperature stage is thermally connected to the probe card through a probe card holder. The temperature that can be achieved with the third temperature stage is lower than the temperature that can be achieved with the first temperature stage. The temperature provided by the third temperature stage can be, for example, in the range of 0.8-1.2 K, or about 1 K. The heat is transferred away from the chuck through one or more thermal links connected between the third temperature stage and the chuck. The heat is transferred away from the probe card through one or more thermal links connected between the third temperature stage and the probe card. The thermal link can be, for example, a cable or bar made of copper or aluminium.

As the chuck is cooled by the cooling unit, heat from the wafer that is mounted on the chuck may transfer to the chuck by conduction. Correspondingly, as the probe card is cooled by the cooling unit, heat from the wafer may transfer to the probe card when the probe card is in electrical contact with the integrated circuits. Heat is transferred by conduction through the contact pads of the integrated circuits and the contact elements of the probe card. The cooling unit thus enables to efficiently cool the wafer through the chuck and the probe card.

An advantage of cooling the chuck and the probe card using the third temperature stage of the cooling unit is that the space in which integrated circuits are tested, i.e. the interior of the first radiation shield, can be more quickly and energy efficiently cooled to a desired testing temperature.

According to an embodiment of the invention the testing device comprises a third radiation shield arranged inside the first radiation shield and enclosing the chuck and the probe card, the third radiation shield being thermally connected to the third temperature stage of the cooling unit.

According to an embodiment of the invention the fixed part of the radiation shield comprises a first lip around the aperture, and the movable part of the radiation shield comprises a second lip arranged at its outer edge, which first and second lips are arranged to face each other. The first lip and/or the second lip can be provided with a seal that is made of non-transparent material such as metal-coated plastic. An advantage of the first and second lips is that a labyrinth seal is formed between the fixed and movable parts of the radiation shield. This provides a tortuous path for photons and thus limits the amount of thermal radiation into the radiation shield.

According to an embodiment of the invention the radiation shield comprises a seal attached to the fixed part or the movable part for shielding a gap between the fixed part and the movable part. The seal can be attached to the fixed part so that the seal encircles the aperture in the fixed part. The fixed part may comprise a lip around the aperture to which lip the seal is attached. The seal can be attached to an outer edge of the movable part. The movable part may comprise a lip at its outer edge to which lip the seal is attached.

According to an embodiment of the invention the radiation shield comprises a solid ring attached with a flexible element to the fixed part for closing a gap between the fixed part and the movable part. The flexible element encircles the aperture in the fixed part.

Radiative heat transfer (emission/absorption) can be reduced by making surfaces of the radiation shield(s) and the inner surface of the vacuum chamber reflecting. The heat reflecting surface can be, for example, polished metal. The fraction of the heat reflecting surfaces can be maximized and only the non-idealities in the geometry are compensated by making the surfaces locally heat absorbing.

According to an embodiment of the invention at least one of the surfaces of the fixed part and the movable part that are facing each other is made heat absorbing. The heat absorbing surface ensures that a photon cannot penetrate from a higher temperature side to a lower temperature side through the gap between the fixed part and the movable part in connection with the aperture. The heat absorbing surface can be, for example, black anodized or painted in black.

According to an embodiment of the invention the means for moving the chuck relative to the probe card comprises a first actuator attached to the second end of the supporting column for moving the supporting column in three perpendicular directions. The movement is transferred through the supporting column to the chuck that is attached to the first end of the supporting column. By using the first actuator, the chuck can be moved horizontally and vertically. The first actuator can be arranged outside the vacuum chamber, or inside the vacuum chamber but outside the radiation shield(s). The first actuator can be, for example, an electrical motor operating a screw, which transfers the rotational movement to linear movement. An advantage of having the first actuator outside the radiation shield(s) is that the heat generated by the first actuator does not heat the space in which integrated circuits are tested, i.e. the interior of the first radiation shield.

According to an embodiment of the invention the means for moving the chuck relative to the probe card comprises a second actuator attached to the second end of the supporting column for rotating the supporting column around its longitudinal axis. The movement is transferred through the supporting column to the chuck that is attached to the first end of the supporting column. The second actuator can be arranged outside the vacuum chamber, or inside the vacuum chamber but outside the radiation shield(s). The second actuator can be, for example, an electrical motor operating a screw, which transfers the rotational movement to linear movement and the linear movement back to rotational movement of the supporting column. An advantage of having the second actuator outside the radiation shield(s) is that the heat generated by the second actuator does not heat the space in which integrated circuits are tested, i.e. the interior of the first radiation shield.

According to an embodiment of the invention the supporting column comprises one or a plurality of tubes. The plurality of tubes can be partly nested in one another or arranged successively one after another in the longitudinal direction of the supporting column. The movable part(s) can be attached between two successive tubes. The supporting column can be a tube that is arranged to pass through the movable part(s). In this case, preferably, the supporting column is provided with thermal radiation shields inside the tube to block the thermal radiation inside the tube. The supporting column can be a one-piece or multi-piece tube. Preferably, the tube has a round cross-section. The supporting column can be made of a metal, such as stainless steel, or other material having good mechanical properties and a low thermal conductivity. An advantage of the supporting column that is made of one or more tubes is that the heat transfer through the supporting column is minimal.

According to an embodiment of the invention the tube is made of a sheet metal. An advantage of the sheet metal is that it can be easily formed into a tube.

According to an embodiment of the invention the wall thickness of the tube is in the range of 0.05 mm to 0.3 mm. An advantage of having the wall thickness of the tube within this range is that it ensures that the heat transfer through the supporting column is minimal and the supporting column is rigid enough to retain its shape.

According to an embodiment of the invention the cooling unit is a dry cryostat using a closed loop helium circulation. When the dry cryostat is used, the vacuum chamber is kept at room temperature (not in a liquid nitrogen or liquid helium bath) and all the low temperature components are located inside the vacuum chamber. The dry cryostat may comprise a plurality of temperature stages, for example, 50 K, 4 K and 1 K stages. An advantage of the dry cryostat is that the space in which integrated circuits are tested, i.e. the interior of the first radiation shield, can be cooled to a temperature below 4 K without immersing the whole system into a liquid helium bath.

The exemplary embodiments of the invention presented in this text are not interpreted to pose limitations to the applicability of the appended claims. The verb "to comprise" is used in this text as an open limitation that does not exclude the existence of also unrecited features. The features recited in the dependent claims are mutually freely combinable unless otherwise explicitly stated.

DETAILED DESCRIPTION OF THE DRAWINGS

The same reference signs are used of the same or like components in different embodiments.

Figure 1:
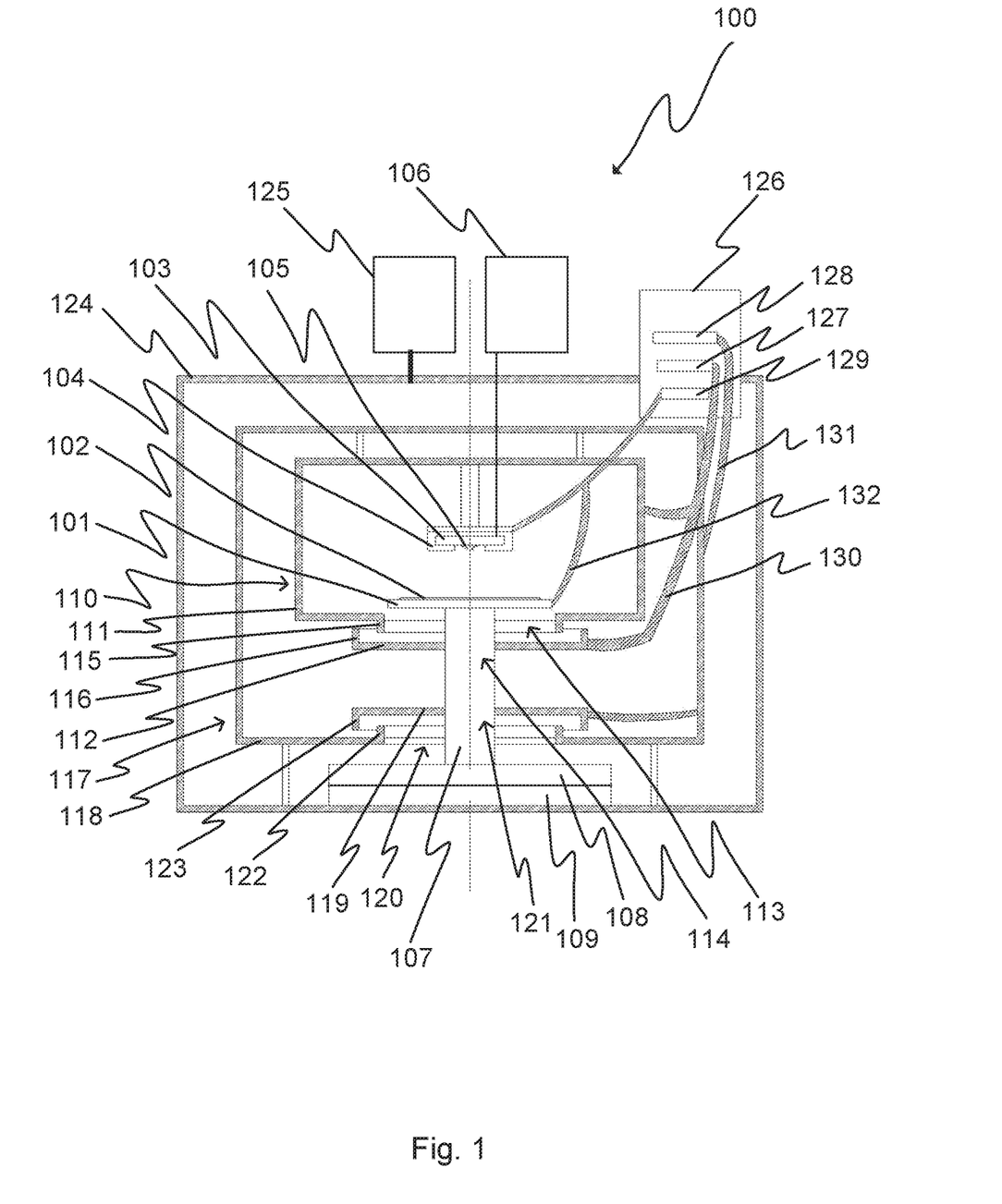
FIG. 1 illustrates a sectional view of a testing device according to a first embodiment of the invention.

FIG. 1 illustrates a sectional view of a testing device according to a first embodiment of the invention. The testing device 100 comprises a chuck 101 for holding a wafer 102 that comprises integrated circuits, and a probe card 103 attached to a probe card holder 104 for electrically contacting the integrated circuits on the wafer 102. The probe card 103 comprises contact elements 105, which can be arranged in electrical contact with contact pads of the integrated circuits. The electrical testing of the integrated circuits is done with an electronic testing unit 106 that is electrically connected to the probe card 103. The probe card 103 provides an electrical path between the electronic testing unit 106 and the integrated circuits on the wafer 102.

The chuck 101 can be moved relative to the probe card 103 with moving means that comprise a supporting column 107 having a first end and a second end. The first end of the supporting column 107 is attached to the chuck 101 so that the chuck 101 is perpendicular with respect to the longitudinal axis of the supporting column 107. The moving means also comprise a first actuator 108 for moving the supporting column 107 in three perpendicular directions, and a second actuator 109 for rotating the supporting column 107 around its longitudinal axis. The first actuator 108 and the second actuator 109 are attached to the second end of the supporting column 107 so that the movement is transferred through the supporting column 107 to the chuck 101.

The chuck 101 and the probe card 103 are arranged inside a first radiation shield 110 that comprises a first fixed part 111 and a first movable part 112. The first fixed part 111 has a first aperture 113 through which the supporting column 107 is arranged to pass so that the first end of the supporting column 107 extends into the interior of the first radiation shield 110. The first movable part 112 has a second aperture 114 through which the supporting column 107 is arranged to pass. The first movable part 112 is positioned below the lower end wall of the first fixed part 111 and attached to the supporting column 107 so that it covers the first aperture 113. The lower end wall of the first fixed part 111 is provided with a lip 115 around the first aperture 113 and the first movable part 112 is provided with a lip 116 arranged at its outer edge and facing the lip 115.

The first radiation shield 110 is arranged inside a second radiation shield 117 that comprises a second fixed part 118 and a second movable part 119. The first fixed part 111 of the first radiation shield 110 is mechanically attached to but thermally isolated from the second fixed part 118 of the second radiation shield 117. The second fixed part 118 has a third aperture 120 through which the supporting column 107 is arranged to pass so that the second end of the supporting column 107 extends out of the second radiation shield 117. The second movable part 119 has a fourth aperture 121 through which the supporting column 107 is arranged to pass. The second movable part 119 is positioned above the lower end wall of the second fixed part 118 and attached to the supporting column 107 so that it covers the third aperture 120. The lower end wall of the second fixed part 118 is provided with a lip 122 around the third aperture 120 and the second movable part 119 is provided with a lip 123 arranged at its outer edge and facing the lip 122.

The second radiation shield 117 is arranged inside a vacuum chamber 124. The second fixed part 118 of the second radiation shield 117 is attached to the vacuum chamber 124. The vacuum chamber 124 allows the integrated circuits to be tested in a controlled environment. The pressure inside the vacuum chamber 124 is controlled with a vacuum pump 125.

The testing device comprises a cooling unit 126 for cooling the wafer 102 to a desired testing temperature and for maintaining the testing temperature during testing of the integrated circuits. The cooling unit 126 comprises three temperature stages 127, 128 and 129, each of which is configured to provide a specific temperature to a part to which it is thermally connected. The first temperature stage 127 is thermally connected to the first radiation shield 110 and the second temperature stage 128 is thermally connected to the second radiation shield 117. The temperature that can be achieved with the first temperature stage 127 is lower than the temperature that can be achieved with the second temperature stage 128. The heat is transferred out of the first radiation shield 110 through thermal links 130 connected between the first temperature stage 127 and the first radiation shield 110. The heat is transferred out of the second radiation shield 117 through thermal links 131 connected between the second temperature stage 128 and the second radiation shield 117. The third temperature stage 129 is thermally connected to the chuck 101 and the probe card 103. The temperature that can be achieved with the third temperature stage 129 is lower than the temperature that can be achieved with the first temperature stage 127. The heat is transferred away from the chuck 101 and the probe card 103 through thermal links 132 connected between the third temperature stage 129, and the chuck 101 and the probe card holder 104.

Figure 2:
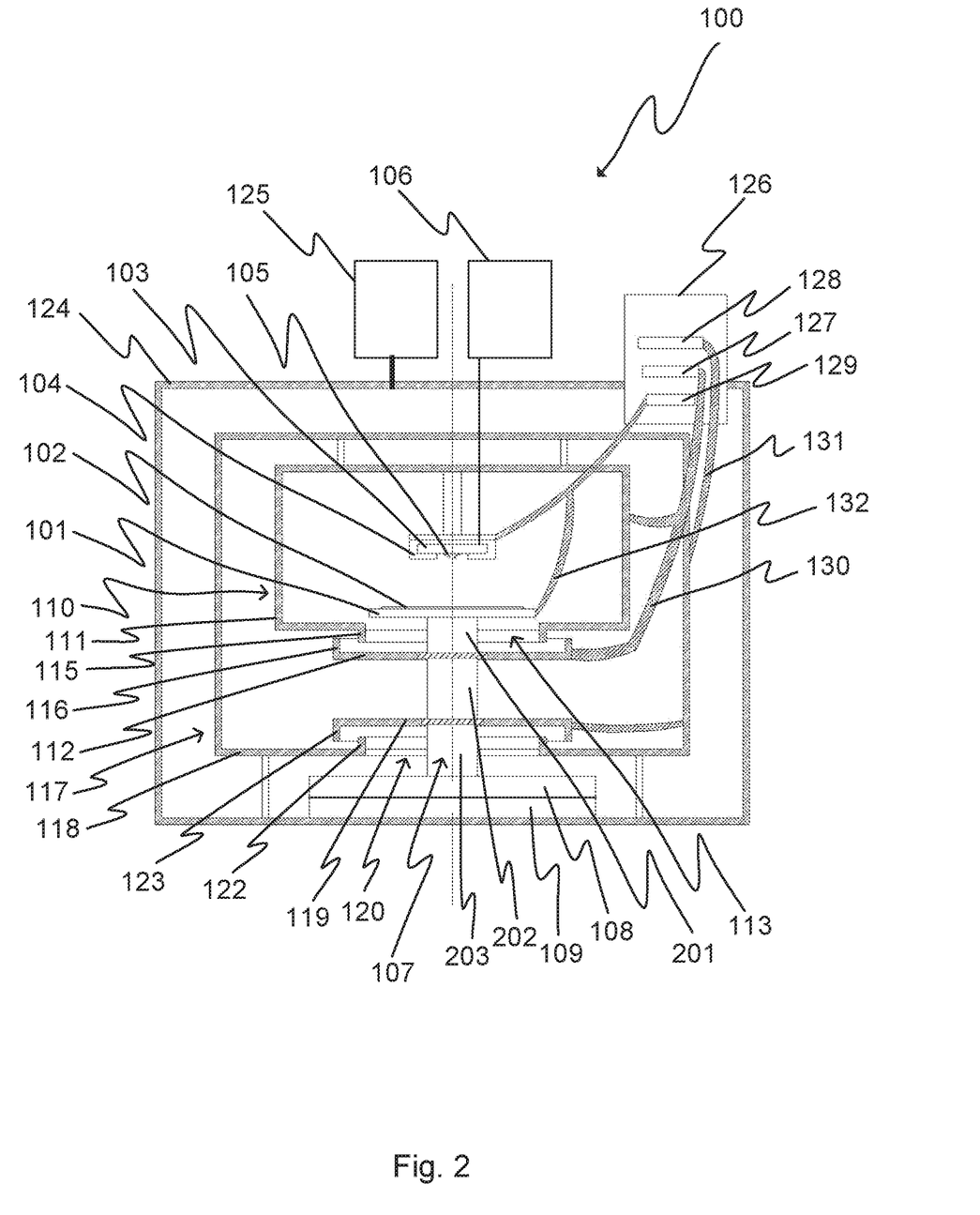
FIG. 2 illustrates a sectional view of a testing device according to a second embodiment of the invention.

FIG. 2 illustrates a sectional view of a testing device according to a second embodiment of the invention. The testing device of FIG. 2 differs from the testing device of FIG. 1 in that the supporting column 107 comprises three column parts 201, 202 and 203, and that the first movable part 112 and the second movable part 119 do not have apertures. A first end of the column part 201 is attached to the chuck 101 and a second end of the column part 201 is attached to the first movable part 112. A first end of the column part 202 is attached to the first movable part 112 and a second end of the column part 202 is attached to the second movable part 119. A first end of the column part 203 is attached to the second movable part 119 and a second end of the column part 203 is attached to the actuators 108 and 109.

Figure 3A:
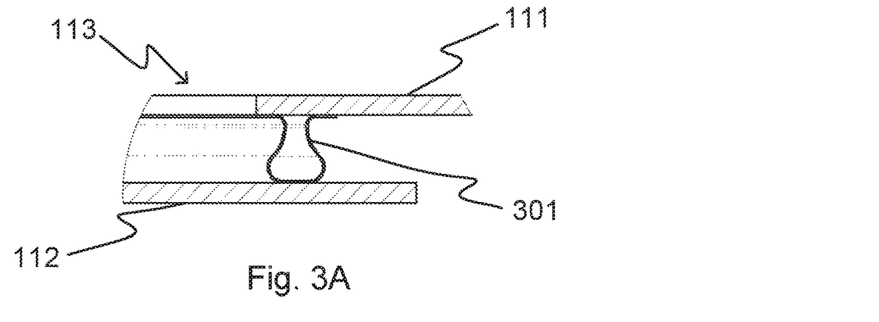
FIGS. 3A-3E illustrate exemplary structures of a radiation shield.
Figure 3B:
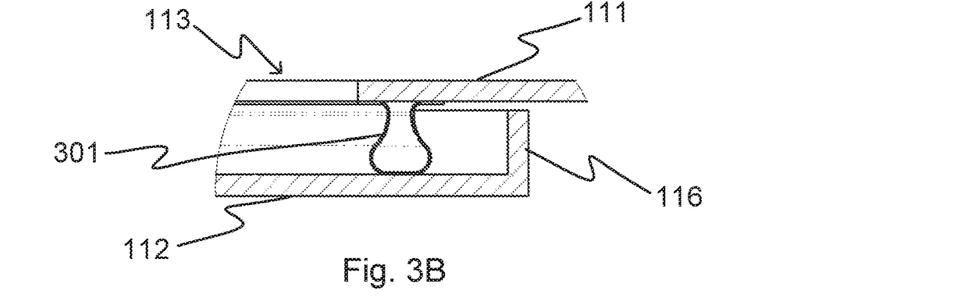
Figure 3C:
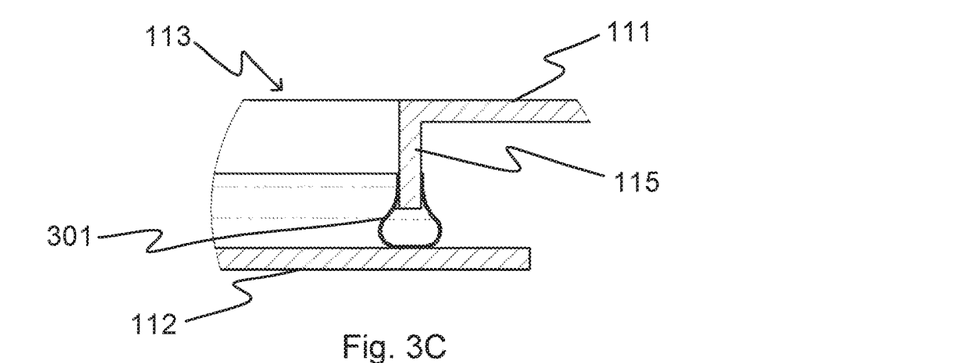
Figure 3D:
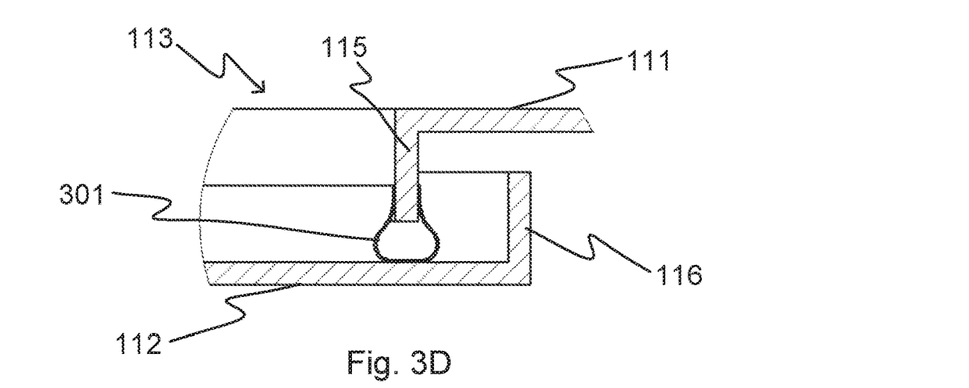
Figure 3E:
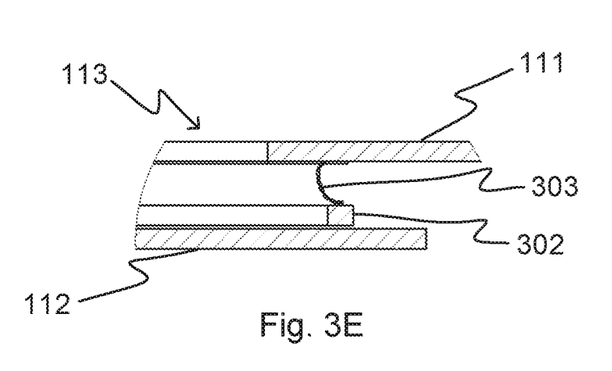

FIGS. 3A-3E illustrate exemplary structures of a radiation shield. More specifically, FIGS. 3A-3E illustrate close-up views of the closed gap between a first fixed part 111 and a first movable part 112 of the radiation shield. In FIG. 3A, there is shown a seal 301 that is attached to the first fixed part 111 so that the seal 301 encircles a first aperture 113. The seal 301 is pressed against the first movable part 112 so that the gap between the first fixed part 111 and the first movable part 112 is closed. The radiation shield of FIG. 3B differs from the radiation shield of FIG. 3A in that the first movable part 112 comprises a lip 116 arranged at its outer edge to reduce the number of photons leaking through the gap. The radiation shield of FIG. 3C differs from the radiation shield of FIG. 3A in that the first fixed part 111 comprises a lip 115 to which the seal 301 is attached. The radiation shield of FIG. 3D differs from the radiation shield of FIG. 3C in that the first movable part 112 comprises a lip 116 arranged at its outer edge to reduce the number of photons leaking through the gap. In FIG. 3E, there is shown a structure in which the gap between the first fixed part 111 and the first movable part 112 is closed by a solid ring 302 that is attached with a flexible element 303 to the first fixed part 111. The flexible element 303 encircles the first aperture 113.

Only advantageous exemplary embodiments of the invention are described in the figures. It is clear to a person skilled in the art that the invention is not restricted only to the examples presented above, but the invention may vary within the limits of the claims presented hereafter. Some possible embodiments of the invention are described in the dependent claims, and they are not to be considered to restrict the scope of protection of the invention as such.

The invention claimed is:

1. A testing device, comprising:
a vacuum chamber,
a chuck for holding a wafer that comprises integrated circuits,
a probe card for electrically contacting the integrated circuits on the wafer,
means for moving the chuck relative to the probe card,
a first radiation shield arranged inside the vacuum chamber and enclosing the chuck and the probe card, and
a cooling unit thermally connected to the first radiation shield,
wherein
the means for moving the chuck relative to the probe card comprises a supporting column having a first end and a second end, the first end of the supporting column being attached to the chuck, and
the first radiation shield comprises a first fixed part having a first aperture through which the supporting column is arranged to pass, and a first movable part that is attached to the supporting column and arranged to cover the first aperture.

2. The testing device according to claim 1, wherein the first movable part has a second aperture through which the supporting column is arranged to pass.

3. The testing device according to claim 1, wherein the testing device comprises a second radiation shield arranged inside the vacuum chamber and enclosing the first radiation shield, the second radiation shield comprising a second fixed part having a third aperture through which the supporting column is arranged to pass and a second movable part that is attached to the supporting column and arranged to cover the third aperture.

4. The testing device according to claim 3, wherein the second movable part has a fourth aperture through which the supporting column is arranged to pass.

5. The testing device according to claim 3, wherein the cooling unit has a first temperature stage that is thermally connected to the first radiation shield and a second temperature stage that is thermally connected to the second radiation shield.

6. The testing device according to claim 5, wherein the cooling unit has a third temperature stage that is thermally connected to the chuck and the probe card.

7. The testing device according to claim 1, wherein the fixed part of the radiation shield comprises a first lip around the aperture, and the movable part of the radiation shield comprises a second lip arranged at its outer edge, which first and second lips are arranged to face each other.

8. The testing device according to claim 1, wherein the radiation shield comprises a seal attached to the fixed part or the movable part for shielding a gap between the fixed part and the movable part.

9. The testing device according to claim 1, wherein the radiation shield comprises a solid ring attached with a flexible element to the fixed part for closing a gap between the fixed part and the movable part.

10. The testing device according to claim 1, wherein at least one of the surfaces of the fixed part and the movable part that are facing each other is made heat absorbing.

11. The testing device according to claim 1, wherein the means for moving the chuck relative to the probe card comprises a first actuator attached to the second end of the supporting column for moving the supporting column in three perpendicular directions.

12. The testing device according to claim 11, wherein the means for moving the chuck relative to the probe card comprises a second actuator attached to the second end of the supporting column for rotating the supporting column around its longitudinal axis.

13. The testing device according to claim 1, wherein the supporting column comprises one or a plurality of tubes.

14. The testing device according to claim 13, wherein the tube is made of a sheet metal.

15. The testing device according to claim 13, wherein the wall thickness of the tube is in the range of 0.05 mm to 0.3 mm.

16. The testing device according to claim 1, wherein the cooling unit is a dry cryostat using a closed loop helium circulation.

* * * * *